United States Patent [19]

Kapoor et al.

[11] Patent Number: 5,166,767
[45] Date of Patent: Nov. 24, 1992

[54] SIDEWALL CONTACT BIPOLAR TRANSISTOR WITH CONTROLLED LATERAL SPREAD OF SELECTIVELY GROWN EPITAXIAL LAYER

[75] Inventors: Ashok K. Kapoor, Palo Alto; J. Frank Ciacchella, Sunnyvale, both of Calif.

[73] Assignee: National Semiconductor Corporation, Santa Clara, Calif.

[21] Appl. No.: 300,154

[22] Filed: Jan. 19, 1989

Related U.S. Application Data

[63] Continuation of Ser. No. 38,161, Apr. 14, 1987, abandoned.

[51] Int. Cl.$^5$ .................. H01L 29/72; H01L 29/04; H01L 27/12
[52] U.S. Cl. ...................................... 257/518; 257/517
[58] Field of Search ............... 357/59 H, 34, 54, 67, 357/4

[56] References Cited

U.S. PATENT DOCUMENTS

| | | | |
|---|---|---|---|
| 3,600,651 | 8/1971 | Duncan | 357/59 |
| 4,396,933 | 8/1983 | Magdo | 357/59 H |
| 4,696,097 | 9/1987 | McLaughlin | 357/59 H |
| 4,703,554 | 11/1987 | Havemann | 357/34 |
| 4,705,559 | 11/1987 | Suda | 357/34 |
| 4,725,874 | 2/1988 | Ooga et al. | 357/59 H |
| 4,795,722 | 1/1989 | Welch et al. | 357/54 |
| 4,812,890 | 3/1989 | Feygenson | 357/34 |
| 4,897,704 | 1/1990 | Sakurai | 357/59 H |

FOREIGN PATENT DOCUMENTS 0189136 7/1986 European Pat. Off. .

OTHER PUBLICATIONS

IBM Technical Disclosure Bulletin, vol. 28, #1, pp. 200-201, Jun. 1985.

Primary Examiner—Mark V. Prenty
Attorney, Agent, or Firm—Townsend and Townsend

[57] ABSTRACT

There is disclosed herein a transistor having a sidewall base contact. The base region of the transistor is in a column of selectively grown epitaxial silicon isolated from adjacent structures in a field of oxide. The sidewall base contact is a layer of doped polysilicon which is embedded in the insulating material surrounding the column of epitaxial silicon. The collector contact is formed of another column of selectively grown epitaxial silicon grown over and in electrical contact with a buried layer underlying the first column of epitaxial silicon. The emitter region is implanted into the top of column doped as the base region. In one embodiment, the base contact is a buried polysilicon layer. In another embodiment, the base contact is epitaxial silicon which is grown over oxide by uncontrolled growth following controlled selective growth. There are also disclosed two processes for making the structure comprised of the steps of forming a layer of oxide, etching two holes in it and growing the epitaxial silicon in the holes. Thereafter, in one embodiment, the oxide is etched back to expose the sidewalls of the columns and polysilicon is deposited, doped and etched to form the sidewall base contacts. In another embodiment, the base contact is formed by allowing the selectively grown epitaxial silicon to grow laterally out over the top of the oxide layer in the columns of epi are grown. The structure is then planarized, the emitter region is formed, and the contact holes are etched and contacts are formed.

19 Claims, 8 Drawing Sheets

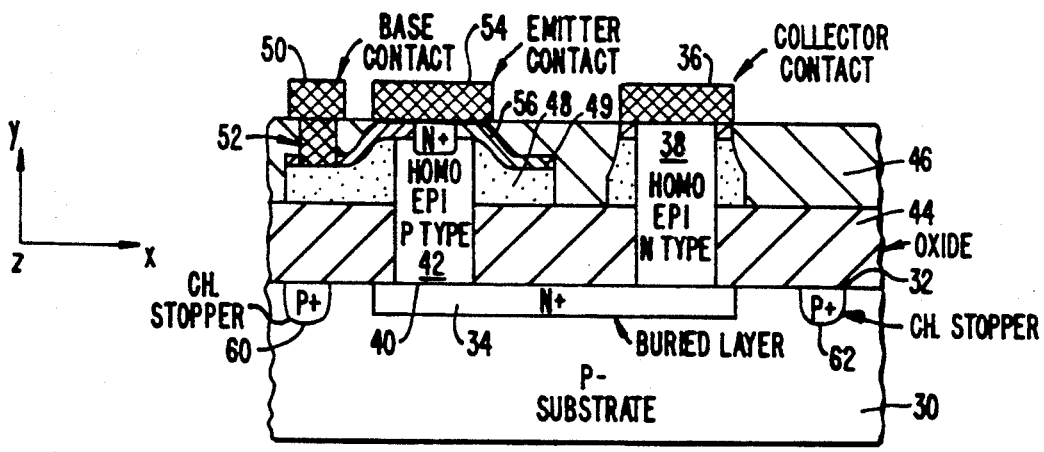
FIG._1.
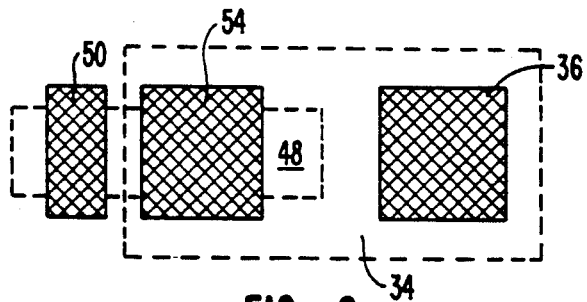
FIG._2.
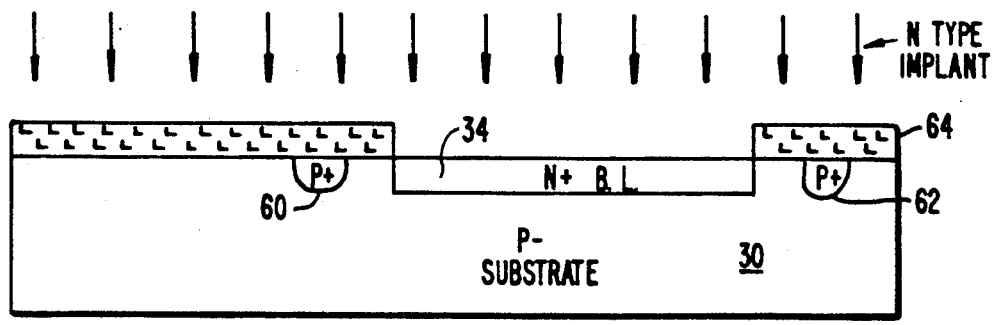
FIG._3.

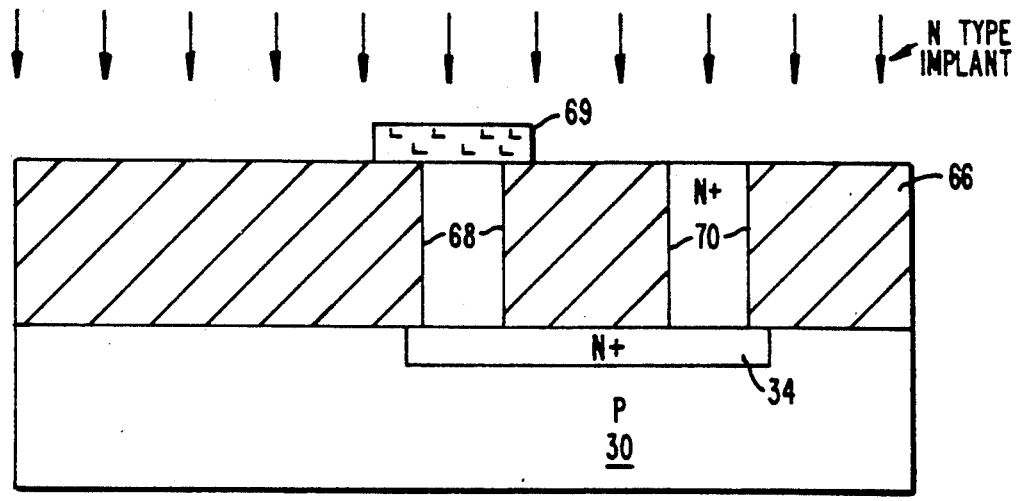
FIG._4.
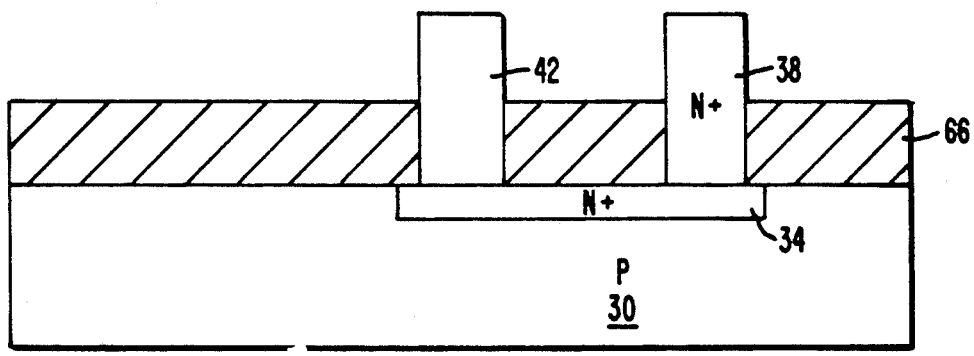
FIG._5.
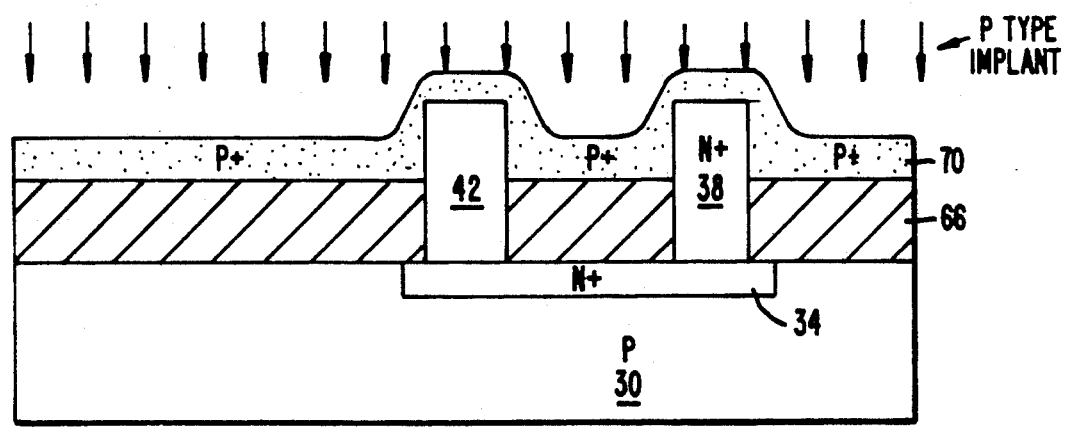
FIG._6.

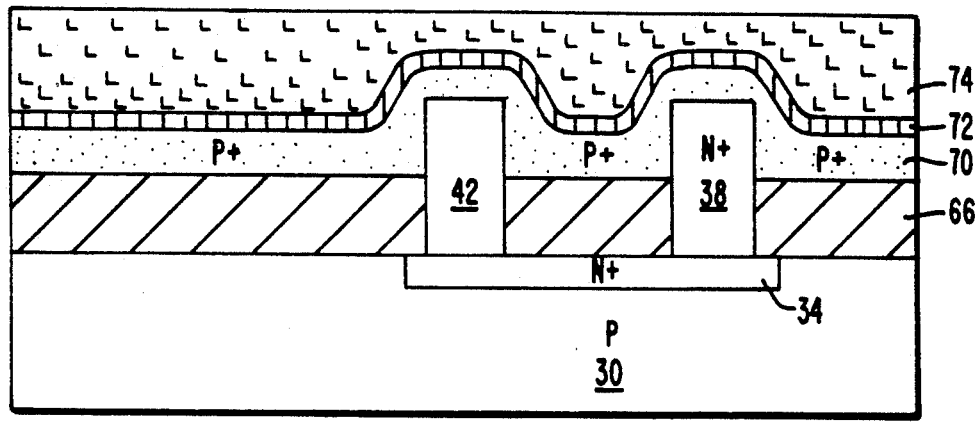
FIG.—7.
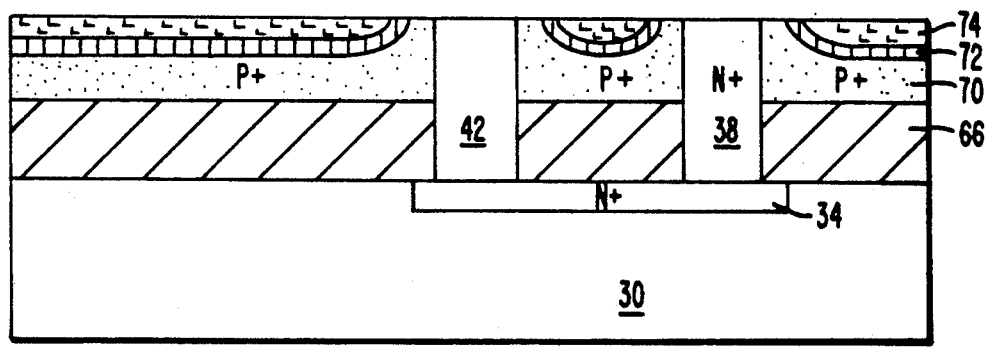
FIG.—8.
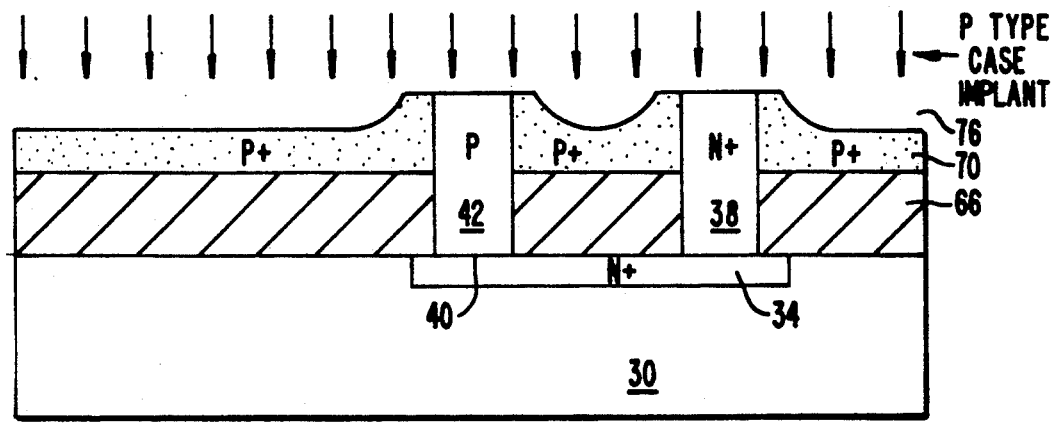
FIG.—9.

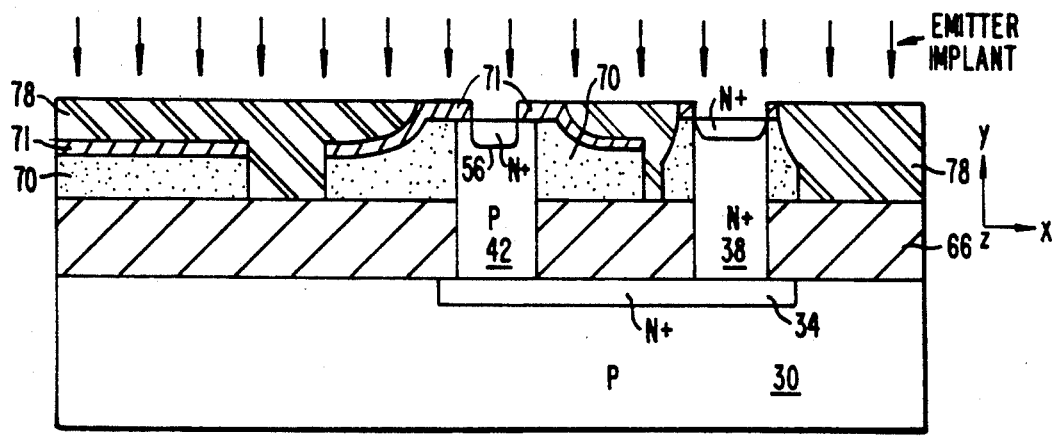
FIG._10.
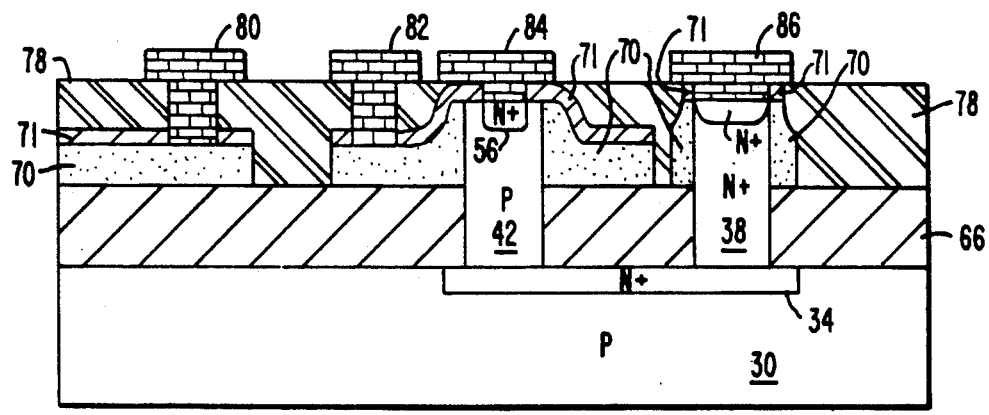
FIG._11.
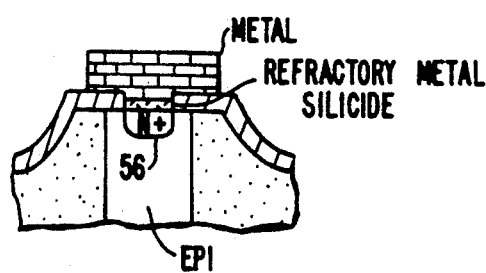
FIG._12.
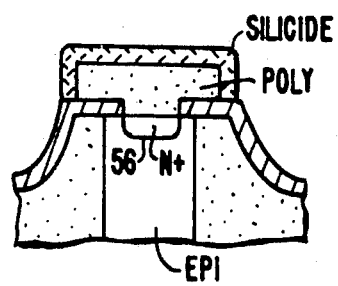
FIG._13.

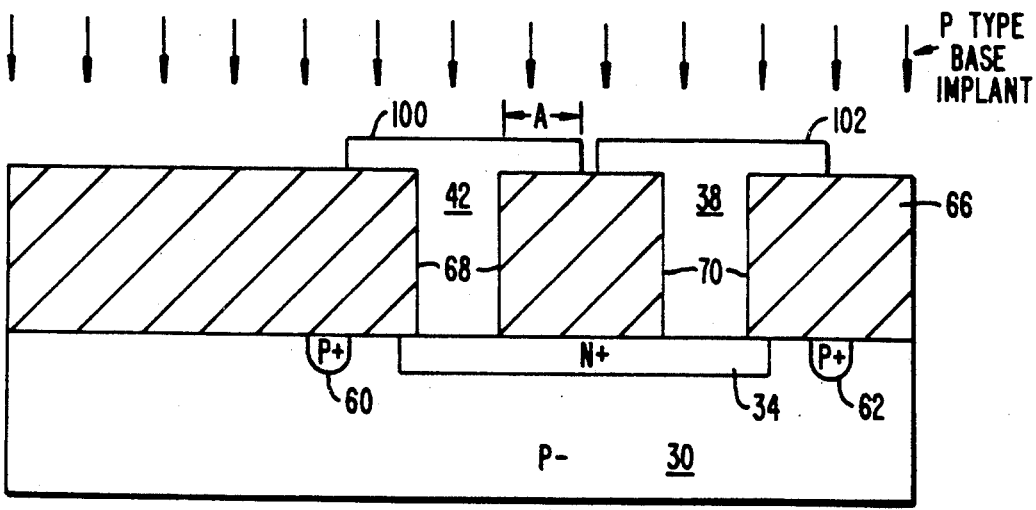
FIG._14.
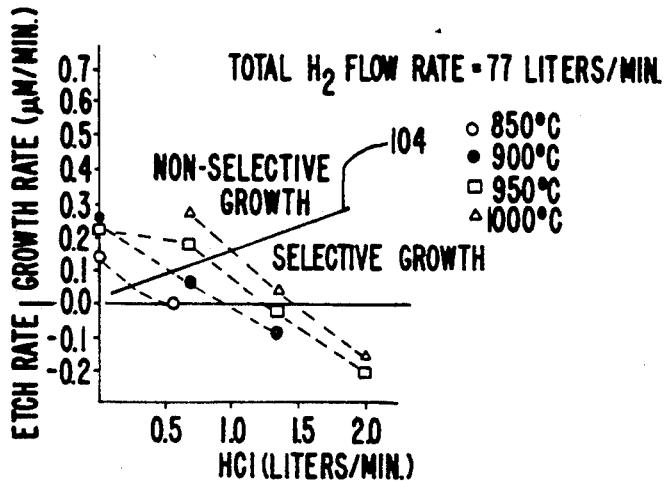
FIG._15A.
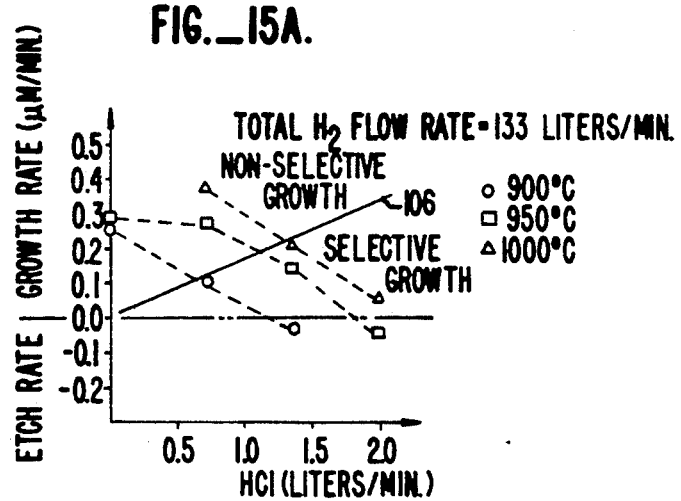
FIG._15B.

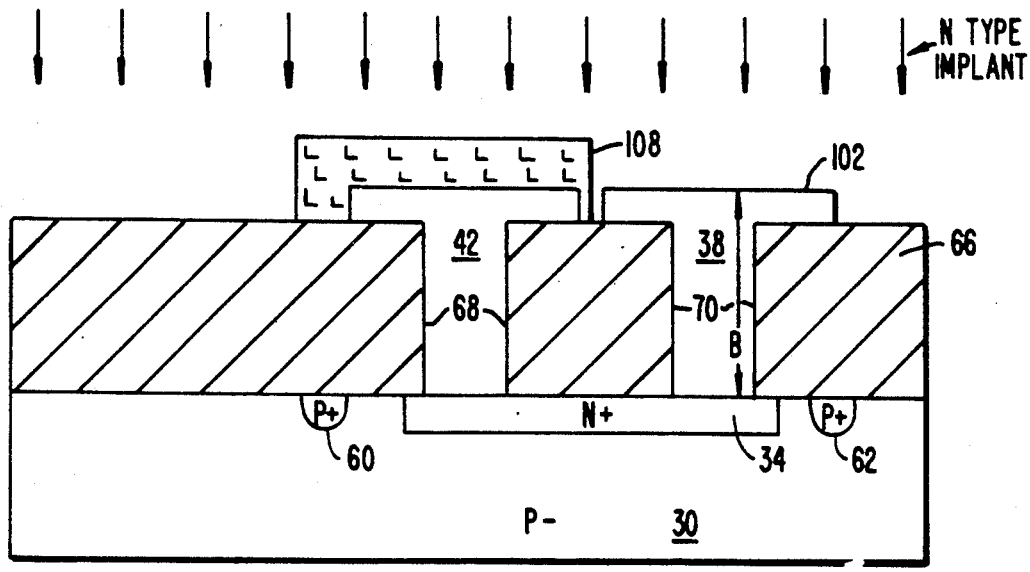
FIG._16.
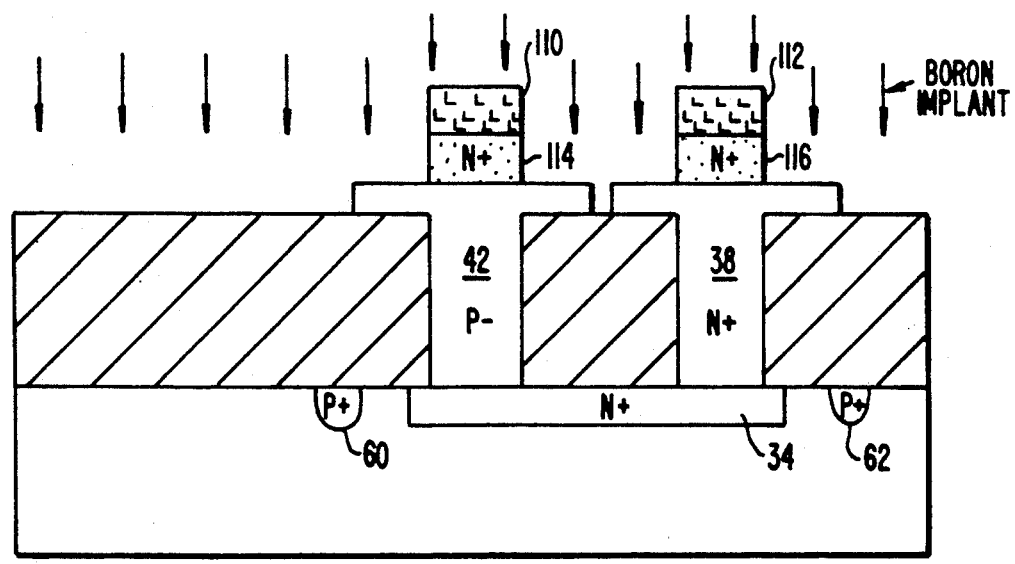
FIG._17.

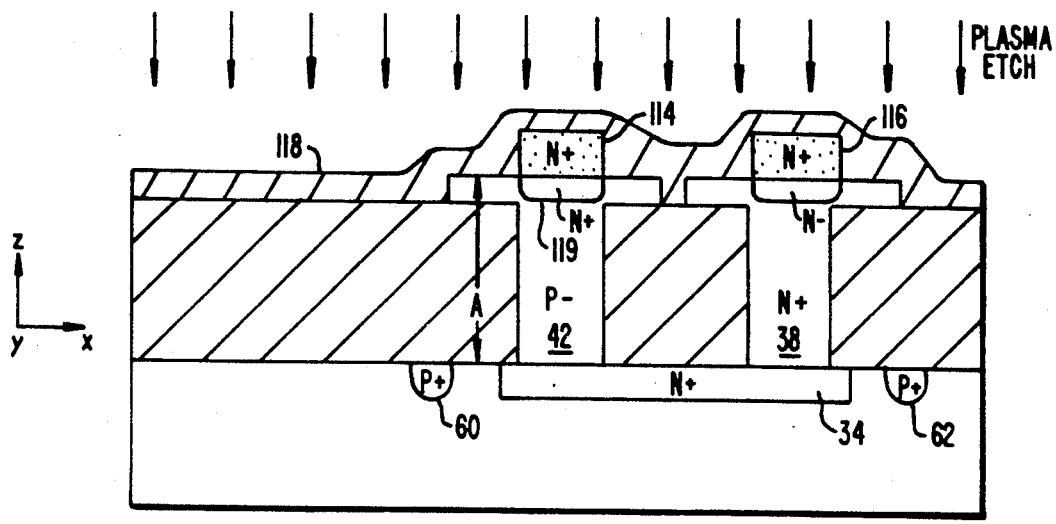
FIG._18.
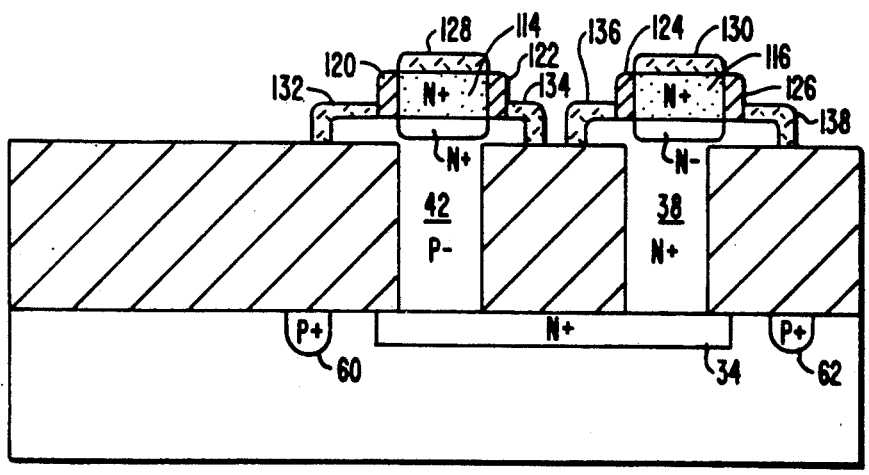
FIG._19.

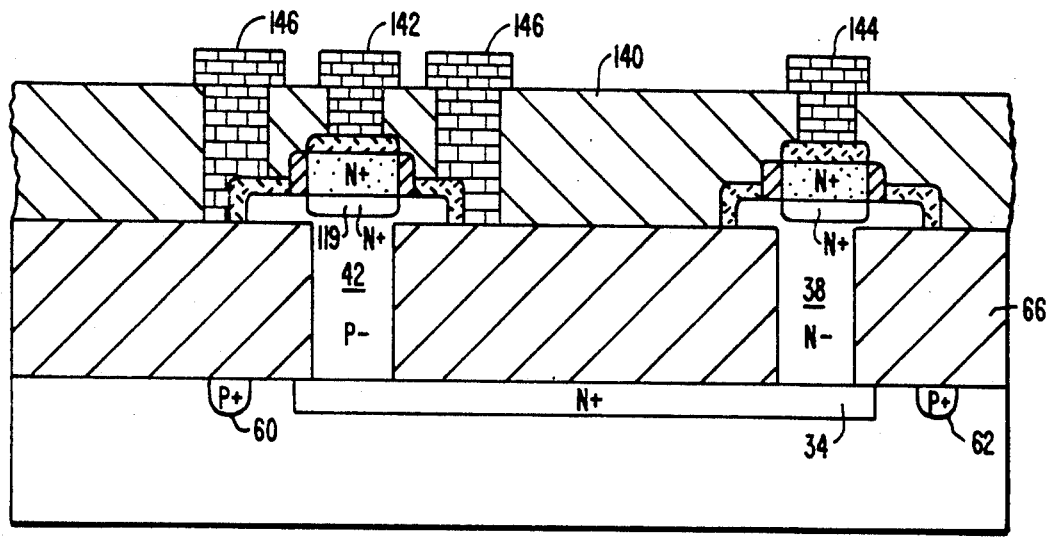
FIG._20.
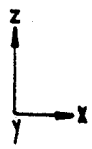
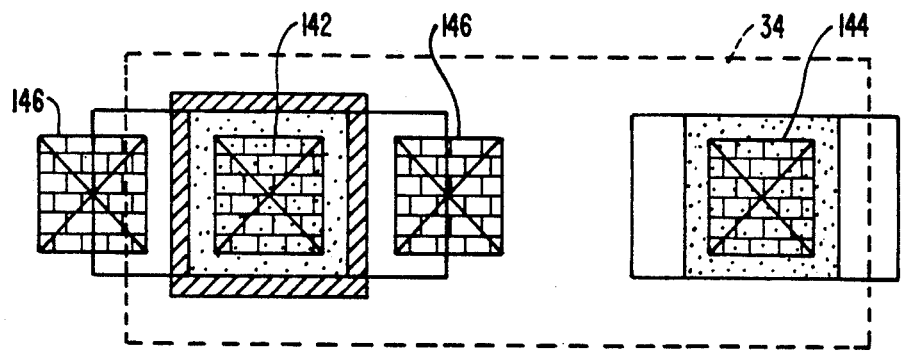
FIG._21.

SIDEWALL CONTACT BIPOLAR TRANSISTOR WITH CONTROLLED LATERAL SPREAD OF SELECTIVELY GROWN EPITAXIAL LAYER

This is a continuation of application Ser. No. 07/038,161, filed Apr. 14, 1987, now abandoned.

BACKGROUND OF THE INVENTION

The invention pertains to the field of integrated bipolar transistor construction, and, more particularly, to the field of bipolar transistors which have a base area with reduced size and the concomitant reduction in the parasitic capacitances and resistance.

Workers in the art of integrated bipolar transistor design have long known that a reduced base area is desirable for several reasons. First transistors with reduced base area have less parasitic junction capacitance associated with the base-collector junction because there is less area of the junction and the parasitic capacitance of this junction is proportional to the area of the junction. Second, the smaller base area means the overall size of the transistor is reduced, and, therefore, more transistors may be put on a single die.

Smaller parasitic capacitances coupled to the base means faster switching operation for such transistors. Since computers typically employ millions of switching transistors and perform millions of operations involving switching by these transistor every second, faster switching transistors mean that more operations per second may be performed. This translates to faster data processing and more output per unit of time. Smaller transistors means more functions may be put on a single integrated circuit die. This translates into cost savings because fewer connections need be formed by soldering because fewer integrated circuits are used to accomplish any given function. Thus, smaller transistors means lower cost electronic products. Further, reliability of such products is increased because a connection made internally on an integrated circuit is far more reliable than a soldered connection made in the external world.

The problem with prior art bipolar transistors is that the base area can only be made as small as the minimum linewidth, D, permits. The minimum linewidth, as those skilled in the art appreciate, defines the size of the smallest geometric feature which may be formed on the surface of an integrated circuit for a given photolithography system. In the prior art, the base area surrounds the emitter region. The base area needs at least one electrical contact formed thereon, and since the minimum dimension on each side of the emitter region is one D. Since the design rules require a certain clearance around the emitter which the base contact may not encroach upon, and since the base contact must be at least one D wide, the minimum size of the base area may not be smaller than the above criteria permit. Thus, the performance levels of prior art transistors have been limited, and improvements, at least in part, have been linked to reductions in minimum obtainable linewidth.

Thus, a need has long existed for an improved bipolar transistor with a smaller base area than is possible with conventional construction.

SUMMARY OF THE INVENTION

In accordance with the teachings of the invention, there is disclosed herein a bipolar transistor with a sidewall base contact. The base area is the same size as the emitter area, and contact to the base is made on the sidewalls of the base area. The transistor is formed in a column of selectively grown epitaxial silicon which is grown in a hole etched in a field of grown and deposited silicon dioxide over a buried layer conventionally formed in a substrate. The oxide is etched back to expose a portion of the selectively grown epitaxial silicon so that the base contact may be formed. The base contact is then formed by depositing a layer of polysilicon over the exposed tops of the selectively grown epitaxial silicon posts (one post is for the collector contact) and doping the polysilicon with boron to lower its resistivity. The emitter and collector contacts are then formed by etching back a layer of resist to expose the tops of the selectively grown epitaxial silicon columns and depositing a layer of PVX glass over the entire structure. The glass is then etched back to expose the tops of the selectively grown epitaxial silicon columns again and metal or other conductors are formed over the top of the glass so as to contact the tops of the epitaxial silicon column. The completed structure for one transistor from the bottom up is comprised of substrate, buried layer, and a pair of epitaxial silicon columns formed in a layer of oxide formed over the substrate. A layer of PVX glass overlies the oxide with a doped polysilicon base contact layer formed at the intersection of the oxide and the PVX glass. A contact hole is formed through the PVX in which metal or other conductive material is deposited to make contact with the base region sidewall.

A more complete summary of the process for manufacturing the sidewall contact bipolar transistor for the oxide etchback embodiment is as follows:

Start with a P−substrate for NPN.
Form buried layer.
Form channel stoppers around areas to contain active devices (optional).
Form silicon dioxide layer over entire wafer.
Grow thermal oxide over substrate.
Deposit CVD oxide over thermal oxide.
Etch two holes in oxide over buried layer.
Use resist and plasma etch to get vertical side walls in holes.
Selectively grow epitaxial silicon in holes in the oxide.
LPCVD with dichlorosilane, hydrogen and HCl present.
Grow a thin layer of oxide in dry oxygen to eliminate the sidewall leakage.
Mask off selectively deposited epitaxial base column and implant selectively deposited epitaxial silicon collector column heavily N type. Energy must be sufficient to cause N type impurities to reach all the way to the buried layer or close enough that diffusion during later heat steps will drive the N type impurities to the buried layer.
Etch back part of the oxide to expose sides of selectively grown epitaxial single crystal silicon.
Deposit polysilicon.
Dope polysilicon P+. An alternative embodiment is to deposit P+ type polysilicon by doping the polysilicon as it is deposited. Implant or diffusion may be used to dope the polysilicon.
Deposit nitride or oxide to keep photoresist away from the underlying poly. Oxide could be thermally grown in some embodiments.
Planarize.
Deposit thin layer of oxide.

Spin on photoresist or TEOS and bake to set or drive off solvents

Etch off part of photoresist.

Spin on more photoresist and bake to planarize (alternative embodiment is to omit certain steps and accept less planar of a surface).

Etchback photoresist to expose at least the tops of the selectively deposited epitaxial silicon.

Implant P type dopants into the exposed epitaxial silicon and poly to dope base. This can be a blanket implant over the entire wafer at a dosage of 10 to the 13th power atoms per cubic centimeter because the collector column is too heavily doped to have its conductivity changed much by this implant.

Remove remaining photoresist.

Oxidize top of poly and top of epitaxial silicon.

Using a mask, define and etch polysilicon to form sidewall base contacts and any conductors or resistors on the polysilicon level. This could be done before the oxidation step next above.

Planarize with insulating material.

Deposit PVX II and reflow, or spin on TEOS and bake to drive off solvents.

Etch contact holes over base column, collector column and over sidewall base contact. Columns must be at least 1D (minimum lithographically obtainable distance or 1 linewidth) on a side plus two times the alignment tolerance D/4 and contact hole for base must be within the perimeter of the base column of epitaxial silicon.

Form emitter region.

Implant N type impurities, or deposit N doped polysilicon and drive in impurities over emitter region and over collector column.

Etch contact holes in planarized insulating layer for base contact and for polysilicon resistors.

Deposit and etch metal to form base, emitter and collector contacts.

In another embodiment, a sidewall contact transistor may be made by use of controlled lateral growth of epitaxial silicon over the top of an insulating layer of oxide. In this embodiment the epitaxial silicon is selectively grown in holes in an oxide layer cut down to a buried layer in an underlying substrate. When the epitaxial silicon growth reaches the surface of the oxide, the reaction conditions are changed so that non selective growth occurs so that the epitaxial silicon grows out over the oxide layer covering the buried layer by 1 or 2 microns. These extensions of epitaxial silicon are covered with silicide as are polysilicon contacts covering the epitaxial silicon and metal contacts are then formed in contact windows which are cut over the emitter and collector polysilicon contacts and over the lateral extensions of the epitaxial silicon serving as the base contact.

The process of forming the controlled lateral growth embodiment is as follows.

1. Form a buried layer as for the oxide etchback embodiment.

2. Form a layer of oxide overlying the buried layer.

3. Form two holes in the oxide overlying the buried layer and selectively grow epitaxial silicon in the holes.

A. When the selective growth reaches the top of the oxide layer (4000 to 8000 angstroms thick), change the reaction conditions by altering the amount of HCl vapor present to create non-selective growth of epitaxial silicon out over the oxide.

4. Implant the column of epitaxial silicon to be the base with P type impurities (N type if PNP devices are to be formed.

5. Implant the column of epitaxial silicon to be the collector with N type impurities.

6. Deposit a layer of polysilicon over the entire structure, dope it N type and etch the emitter and collector contacts.

7. Using the photoresist mask used to define the polysilicon contacts and the polysilicon so etched as a mask, implant the lateral extensions of the epitaxial silicon with P type impurities.

8. Heat treat the structure at a temperature and for a time sufficient to drive N type impurities out of the emitter polysilicon contact into the base epitaxial silicon so as to form an emitter region.

9. Form a layer of oxide or nitride insulating material over the entire structure by chemical vapor deposition and anisotropically etch the oxide to form insulating shoulders around the outside edges of the polysilicon contacts.

10. Form a layer of silicide over the exposed surfaces of the polysilicon contacts and the exposed surfaces of the lateral extensions of the epitaxial silicon.

11. Form a planarized layer of insulating material over the structure and etch contact holes therein over the emitter, collector and base contacts 12. Form conductive contacts in said contact holes.

BRIEF DESCRIPTION OF THE DRAWINGS

FIG. 1 is a cross sectional view of the sidewall contact transistor of the preferred embodiment.

FIG. 2 is a plan view of the transistor of FIG. 1 looking straight down along the y axis from above the emitter contact.

FIG. 3 is a cross sectional view of the transistor of FIG. 1 at an early stage in the process after the buried layer has been formed.

FIG. 4 shows the transistor structure after a layer of grown and deposited oxide is formed and holes have been etched therein in which selectively grown epitaxial silicon is grown and during an N type implant to convert the collector column to N type.

FIG. 5 shows the transistor structure after the epitaxial single crystal silicon has been selectively grown in the holes and after the oxide layer has been etched back to expose the top portions of each column.

FIG. 6 is a view of the transistor structure after the polysilicon layer from which the sidewall base contact will be formed is deposited.

FIG. 7 is a view of the transistor after a layer of nitride or oxide and a layer of photoresist have been deposited over the doped polysilicon layer.

FIG. 8 shows the transistor structure after etchback of the photoresist to expose the tops of the epitaxial silicon columns.

FIG. 9 shows the P type base implant which is used to dope the base region and the base sidewall contact polysilicon to the proper conductivity level.

FIG. 10 shows the structure in cross section after a planarization step has been performed to add an insulating layer over the top of the polysilicon layer and after the protective oxide layer has been formed and etched.

FIG. 11 shows the finished transistor structure after the metal contacts used in the preferred embodiment of the method have been formed FIG. 12 shows a refractory metal silicide contact structure.

FIG. 13 shows another type of contact structure which may be employed in the transistor of the invention using polysilicon and silicide.

FIG. 14 shows the structure of the controlled lateral growth embodiment during the base implant step.

FIG. 15A and 15b show the relationships between reaction condition for selective and non selective growth for various HCl flow rates.

FIG. 16 shows the structure of the device during the N type sink implant to dope the collector region.

FIG. 17 hows the structure after the emitter and collector polysilicon contacts have been doped and etched and during an implant of lateral epitaxial silicon.

FIG. 18 shows the structure during the steps of forming the insulating oxide spacers.

FIG. 19 shows the structure of the device after the silicide layers have been formed.

FIG. 20 shows a cross section of the completed device.

FIG. 21 shows a top view of the completed device.

DETAILED DESCRIPTION OF THE PREFERRED EMBODIMENT

Oxide Etchback Embodiment

FIG. 1 is a cross sectional view of the sidewall contact transistor of the preferred embodiment. The transistor shown is an NPN device but the structure of the invention and the method of making it work also for PNP type devices. The transistor is formed on a P− type substrate 30 having a conventional doping level. At the surface 32 of the substrate there is formed a heavily doped N+ type buried layer 34. This buried layer serves the conventional purpose of reducing the collector contact resistance along the path from a collector contact 36, through an N type selectively grown column of single crystal silicon 38, and the buried layer 34 to the base-collector junction 40.

A base region 42 is formed of P type selectively grown epitaxial single crystal silicon. Both columns of selectively grown epitaxial single crystal silicon 38 and 42 are grown in holes etched in a field of grown and deposited silicon dioxide 44 underlying a field of deposited PVX glass 46. The manner in which this is done will become clear from the discussion below giving the method of manufacture of the device.

At the intersection of the PVX glass 46 and the oxide 44 there is formed a sidewall base contact 48 around the selectively grown epitaxial single crystal silicon column 42 only. The base contact is formed of p doped polysilicon, and is coupled to a highly conductive base contact 50. The base contact may be metal, silicide, heavily doped polysilicon or some other highly conductive material as will be understood by those skilled in the art. The base contact 50 overlaps the edges of a base contact window 52 by an alignment tolerance distance. The base contact polysilicon 48 extends laterally in the x direction far enough that the contact hole 52 having at least the minimum linewidth dimension plus an alignment tolerance for the overlap of the base contact 50 plus an alignment tolerance defined by the design rules for the spacing between the base contact 50 and an emitter contact 54 may be maintained.

An emitter region 56 of N+ doped selectively grown epitaxial single crystal silicon is formed at the top of the column 42. Overlying the emitter region 56 is the emitter contact 54. It may be made of the same material as the base contact. The same is true for the collector contact 36.

FIG. 2 is a plan view of the transistor of FIG. 1 looking straight down along the y axis from above the emitter contact. The relative sizes of the base contact 50, the emitter contact 54 and the collector contact 36 and the spacing between these contacts is exemplary only. Those skilled in the art will appreciate that any of these factors may be changed to suit individual user process parameters.

The process of Manufacture

FIG. 3 is a cross sectional view of the transistor of FIG. 1 at an early stage in the process after the buried layer has been formed. The stage of FIG. 3 is reached by conventional methods of forming the buried layer 34. Starting with a P− substrate doped to about $5 \times 10$ to the 14th power impurity atoms per square centimeter, a layer of photoresist is deposited and developed to expose the portion of the substrate 30 where the buried layer 34 is to be formed. An N type implant is then performed to dope the exposed portion of the substrate N+ in conductivity to form the buried layer 34. Next, a layer of oxide (0.3 microns thick) is grown on the wafer and a layer of photoresist (not shown) is deposited, masked, and developed to expose small channel stopper regions 60 and 62 (they are actually part of a ring surrounding the entire buried layer 34). After the holes for the channel stoppers 60 and 62 are formed in the photoresist, a heavy dose of p type impurities is implanted or diffused into the substrate at the locations 60 and 62 to form the channel stoppers. The doping levels and implant energies if the channel stoppers are implanted are well known in the art. The ultimate conductivity desired for these channel stoppers is usually around $5 \times 10$ to the 16th power to $5 \times 10$ to the 17th power. The doping of the substrate 30 should be kept as low as possible to minimize the collector to substrate capacitance.

FIG. 4 shows the transistor structure after a layer of grown and deposited oxide is formed and holes have been etched therein in which selectively grown epitaxial silicon is grown and during an N type implant to convert the collector column to N type. After the buried layer has been formed, the photoresist layer 64 is removed, and a layer of silicon dioxide 66 (hereafter sometimes referred to as oxide) is formed. This layer 66 is formed by thermally growing a first layer of oxide, and then depositing another layer of oxide on top of the first layer by chemical vapor deposition, low pressure chemical vapor deposition or some other technique. The manner of depositing oxide is well known to those skilled in the art. In alternative embodiments, the deposited oxide layer may be eliminated and the thermally grown oxide layer may be grown to the desired thickness. The thickness of the composite layer of oxide is determined by the desired base width (dimension in the y axis) of the base region. Generally, the desired thickness of the composite oxide layer is about 0.5 to 2 microns, but other thicknesses will work for some applications. Those skilled in the art appreciate that the base width is critical to the performance of the transistor, and is an important parameter in determining the gain and high frequency cutoff/switching speed of the transistor. Thus, the thickness of the oxide layer 66 should be chosen according to the desired base width and balanced with the other parameters of the process such as the implant energy for the emitter formation step to get the desired transistor characteristics.

The first layer of oxide is to provide good electrical integrity for the insulation layer since thermally grown oxide has fewer pin holes than deposited oxide In the preferred embodiment, the first layer of thermal oxide is grown to a thickness of 1000 angstroms. The composite layer of oxide 66 will serve as the field oxide in which the individual transistors are isolated from one another.

After the layer of oxide 66 is formed, two holes 68 and 70 are etched therein. These holes essentially will act as the isolation islands for the base-emitter junction and the collector contact when they are later filled with selectively grown epitaxial single crystal silicon. In the preferred embodiment, these holes are formed by anisotropic, reactive ion etching ("plasma etching") so that the walls are vertical. Single layer or multiple layer resist may be used to define the location of the holes 68 and 70. Wet etching may also be used, but this is not preferred because wet etching is generally isotropic and laterally etches while vertical etching is occurring. Because it is generally desirable to keep the emitter junction at the smallest possible area to minimize the parasitic unction capacitances which afflict the transistor, it is desirable to make the hole 68 one D plus two times the alignment tolerance of D/4 on a side. The same is true for the hole 70, except, for the collector contact, the reason for minimizing the size of the hole is to save space since the base collector junction 40 is in the other column of silicon formed in hole 68. Thus wet etching is not preferred because the walls will not be vertical and the size of the resulting hole will not be as well controlled.

The single crystal silicon columns 42 and 38 are grown using a known process using a conventional low pressure epitaxial growth reactor. The selective deposition of the epitaxial single crystal silicon occurs when dichlorosilane mixed with hydrogen is caused to flow through the reactor with hydrochloric acid vapor present. This process is described in an article by John O. Borland and Clifford I. Drowley, entitled "Advanced Dielectric Isolation Through Selective Epitaxial Growth Techniques", Solid State Technology, August 1985, pp. 141-148. Other articles describing the process include: Jastrzebski, "Silicon CVD for SOI: principles and possible Applications". Solid State Technology, September 1984, pp. 239-243; Jastrzebski, "Device Characterzation on Monocrystalline Silicon Grown Over SiO2 by ELO (Epitaxial Lateral Overgrowth) Process", IEEE Electron Device Letters. Vol. EDL 4, No. 2, February 1983; and Jastrzebski et. al, "Growth Process of Silicon Over SiO2 by CVD: Epitaxial Lateral Overgrowth Technique", J. Electrochem. Soc.: Solid State Science and Technology, July 1983, Vol 130, No. 7, pp. 1571-1580. All of these articles are hereby incorporated by reference. In the article from Solid State Technology from August 1985, the authors teach use of a P type substrate having <100> crystal orientation and a resistivity of from 15 to 25 ohm-centimeters. A two micron oxide layer was grown on the substrate and a tri-layer resist mask process was used to provide vertical resist sidewalls with an anisotropic etch in plasma to attain near vertical sidewalls. Selective epitaxial growth was then performed under a wide range of conditions in a radiantly heated barrel reactor. SiH2Cl2 was used as the silicon source gas. It was found that temperatures of deposition from 1100 to 826 degrees centigrade worked at pressures ranging from atmospheric down to 20 torr. It was also found that the amount of HCl required for good selectivity decreased as the deposition temperature decreased. In the preferred embodiment a deposition temperature of 1000 degrees centigrade and a pressure of 45 torr was used. Generally, a deposition pressure of from 25-80 torr is preferred.

After the selective growth of the epitaxial silicon in the holes 68 and 70, the wafer is heated at 800 to 1000 degrees centigrade for 30 minutes in dry oxygen to eliminate "sidewall leakage", i.e., leakage or conduction along the interface between the homoepitaxy and the field oxide. Next, a layer of photoresist 69 is put on the wafer to mask off the epi in the hole 68. Then an N type implant is performed to dope the epi in the collector column N+. The energy of this implant should be such as to cause the N type dopants to reach the buried layer 34 or to get close enough that the N type dopants will reach the buried layer later in the process during high temperature steps.

FIG. 5 shows the transistor structure after the epitaxial single crystal silicon has been selectively grown in the holes and after the oxide layer has been etched back to expose the top portions of each column. After the epitaxial silicon 42 and 38 is grown, the oxide layer 66 is etched back to expose the sidewalls of the epitaxial silicon. This etch is a conventional wet etch using hydrofluoric acid diluted with water. Other well known non selective etch processes may also be used which do not attack epitaxial silicon. The purpose of this etch is to expose the sides of the columns so that the sidewall base contact may be formed. The thickness of the exposed column after the etch is 0.2 to 0.5 micrometers.

FIG. 6 is a view of the transistor structure after the polysilicon layer from which the sidewall base contact will be formed is deposited. The polysilicon layer is conventionally deposited using low pressure chemical vapor deposition. The thickness of the polysilicon layer 70 is less than the height of the exposed column of silicon (0.15 to 0.3 micrometers). The thickness of the polysilicon layer 70 should be sufficient so as to not unduly increase the base series resistance of the contact structure. FIG. 6 also shows a P type implant to convert the polysilicon layer 70 to P type conductivity. The polysilicon layer should be doped to an impurity level of approximately $10^{15}$ atoms per square centimeter (implant dose level). The implant energy should be about 20 to 60 KEV. but the energy level should not be substantially higher than this range lest the implant impurities pass completely through the polysilicon and enter the region which is later to be converted to the emitter region.

FIG. 7 is a view of the transistor after a layer of nitride or oxide and a layer of photoresist have been deposited over the doped polysilicon layer. A protective layer 72 of some material must be deposited over the polysilicon layer 70 to prevent any impurities in the photoresist from entering the polysilicon layer 70 and altering the characteristics of the transistor. In the preferred embodiment this protective layer 72 is nitride, but in alternative embodiments, the protective layer 72 may be silicon dioxide.

After the protective layer 72 is deposited or otherwise formed, a layer of photoresist 74 is spun on over the protective layer 72 to planarize the structure. Any planarization technique will work at this point in the process. Several such processes are known. Any of them which can form a substantially planar surface 76 will suffice for purposes of practicing the invention. In the preferred embodiment, the planarization is carried out by spinning on a first layer of photoresist or TEOS 74. This layer is then baked to drive off the solvents. Next, part of the layer 74 is etched away, and another layer of photoresist or TEOS is spun on and baked to drive off the solvents.

FIG. 8 shows the transistor structure after etchback of the photoresist to expose the tops of the epitaxial silicon columns. An isotropic ion etch is used for this step such that photoresist nitride and polysilicon may all be etched at the same rate. Such an etch is conventional using CHF3 gas, but any etch which can etch photoresist, nitride and polysilicon at the same rate will suffice for purposes of practicing the invention. The etch should be stopped when the top surface of the epitaxial columns is exposed. In alternative embodiments, this etchback step may be two etch steps. The first etch will remove the photoresist until the top of the nitride is exposed. Then a different etchant may be used to remove the nitride and polysilicon to expose the tops of the epitaxial silicon. The etch step or steps should be timed such that the etching is stopped when the tops of the columns of epitaxial silicon are exposed without the etch step removing substantial amounts of the epitaxial silicon columns. Control of the etching to within plus or minus 1000 angstroms will be adequate at this point in the process, because the emitter and base structures have not yet been formed. Thus there is less need to precisely control the etching rate and time. The reason that the foregoing steps of putting on the protective layer and photoresist and etching back to expose the tops of the epitaxial silicon columns are performed is to get the polysilicon off the tops of the columns after forming the sidewall base contacts. Any process which can get the polysilicon from the layer 70 off the tops of the columns of epitaxial silicon 42 and 38 without removing the polysilicon from the sides of the epitaxial silicon will suffice for purposes of practicing the invention. The reason the photoresist layer is needed in the preferred embodiment of the process is because of its property to form a thinner layer of material on the top of projecting portions of the topography than on flat portions polysilicon, on the other hand deposits in a manner which conforms to the topography such that, roughly speaking, the polysilicon that forms over the projecting portions of the epitaxial silicon columns 42 and 38 forms at approximately the same thickness on the tops and on the sides. Thus, if an attempt was made to etch the polysilicon off the top of the columns 42 and 38 without the use of the photoresist layer 74, the isotropic etch would remove the polysilicon from the sides of the columns 42 and 38 at the same rate as it was removed from the top. The result would be that by the time all the polysilicon was removed from the tops of the columns 42 and 38, it would also have been removed from the sides. Thus no polysilicon would remain in contact with the sides of the epitaxial silicon columns from which the sidewall contacts could be formed. Because the photoresist forms a thicker layer over the polysilicon contacting the sides of the columns 42 and 38 than over the polysilicon in contact with the tops of the columns, the etch reaches the top of the columns 42 and 38 before it removes all the polysilicon in contact with the sides of the columns 42 and 38. Any other method which accomplishes this function will suffice so long as it is otherwise compatible with the process and the structure being formed.

FIG. 9 shows the P type base implant which is used to dope the base region and the base sidewall contact polysilicon to the proper conductivity level. Before this base doping implant, the remaining photoresist and protective layer 72 left over from the steps of FIG. 8 are removed. There is no need to form a protective photoresist layer over the collector epi 38, because the dosage level of the base doping implant is not so heavy as to significantly change the heavy N+ doping of the collector epi. The additional P type impurities entering the P+ polysilicon will improve its conductivity. In alternative embodiments, the P type base implant of the base epi 42 may be performed before the remaining photoresist 74 and the remaining protective layer 72 are removed. The base implant is performed at 15 to 40 KEV in the preferred embodiment with a dosage level of approximately 5 to $20 \times 10^{12}$ atoms per square centimeter. The reason this relatively low energy and light doping is used is to maintain good control over the base width. It is important for the high frequency performance of the transistor to maintain a shallow base width. Further the doping should be light to minimize the base-emitter and base-collector unction capacitances which slow down switching of the transistor. However, the doping should not be so light and the base width so narrow as to adversely affect the reverse bias breakdown voltage. This causes increased probability of punch through which could ruin the transistor. Those skilled in the art will appreciate how the base width may be controlled precisely using the implant energy and dosage level. Higher doping levels or higher energy will result in greater base width and a lower high frequency cutoff point. The doping level of the base also affects the current gain beta of the transistor.

After the base epi 42 is doped P type, a new layer of photoresist (not shown) is deposited and developed to define the sidewall base contacts in the polysilicon layer 70. This photoresist pattern will prevent the portion of the polysilicon layer 70 which will be the sidewall base contact from being etched away. This pattern includes the base sidewall contacts, and can include resistors in the polysilicon layer 70 and interconnections between the bases of various transistors in a circuit being formed and other nodes or elements in the circuit. Either before or after the etch of the polysilicon, a thin layer of oxide 71 is grown over the exposed polysilicon 70 and epitaxial silicon 42 and 38. The purpose of this thin layer of oxide is to prevent a base emitter short from occurring. Because the etchback step of FIG. 8 leaves the polysilicon layer 70 even with the top of the epitaxial silicon columns 42 and 38, there would be a possibility of a short between the emitter contact when it is later formed and the sidewall base contact. The oxide layer 71 prevents this short from occurring. In alternative embodiments, some other method of preventing this possible short from occurring may be used. Any method which prevents the short will suffice. The etchback of the polysilicon layer 70 also leaves small sections of the polysilicon layer 70 surrounding the collector contact 38 as seen in FIGS. 10 and 11. The layer of oxide 71 also forms on top of these layers. These polysilicon shoulders are irrelevant to the invention in that they are not necessary to the functioning of the device.

FIG. 10 shows the structure in cross section after a planarization step has been performed to add an insulating layer over the top of the polysilicon layer and after the protective oxide layer has been formed and etched. In the preferred embodiment, a layer of PVX II glass 78 is deposited over the entire structure and reflowed at a temperature of between 800 to 1000 degrees centigrade to planarize the topography of the wafer. This reflow step also has the effect of annealing any damage caused by the base implant. PVX II is a well known material in the prior art. Typically, PVX II is deposited using low pressure chemical vapor deposition at approximately 400 to 450 degrees centigrade. Other planarization methods and compositions will work equally well. Such planarization methods and compositions include but are not limited to the disclosure of U.S. patent application entitled "German silicate Spin-On Glasses", Ser. No. 747,470, filed Jun. 21, 1985 by Bill Lehrer which is hereby incorporated by reference. The planarization step represented by FIG. 10 may be omitted in some embodiments, but its presence is preferred because it reduces step coverage problems with later metallization layers. Further, flat surfaces give better linewidth control in photolithography systems than do surfaces with topographical variations in the distance of points on the surface from the lens of the optical system used to project the image of the mask.

The temperature of the reflow step is not critical to the invention. The base implant anneal step and the reflow step may be combined into one heat step. In alternative embodiments these two heat steps may performed separately. If spin on TEOS is used for planarization, a separate anneal heat step must be used to repair the damage from the base implant because the TEOS bake to drive off the solvents is not of a high enough temperature to anneal implant damage. This anneal step is typically performed at 900 to 950 degrees centigrade. Alternatively, a layer of oxide may be deposited by CVD and planarized by a suitable method.

After the planarized insulating layer is deposited, it is etched back using a plasma etch until the top of the silicon dioxide layer 71 is exposed. The etch time should be controlled so that there remains some insulating material over the top of the resistors and sidewall base contacts in the poly layer 70 and over the epi columns 42 and 38, but the timing is not otherwise critical. Some insulating material in the layer 71 must be maintained after the etchback step to prevent a short between the base contact polysilicon and the emitter when the emitter contact metal 84 is deposited as shown in FIG. 11.

FIG. 10 also shows an N type emitter forming implant step. Before this implant may be performed, a window must be cut in the protective oxide layer 71 which lies over the tops of the epitaxial silicon columns 42 and 38. To form these windows, an etch mask of photoresist (not shown) is deposited and developed so as to expose for etching two windows. These windows in the photoresist lie within the perimeters of the tops of the epitaxial silicon columns 42 and 38. To maintain high yield, these windows should be aligned so that protective oxide 71 always remains over the edges of the polysilicon layer 70 in contact with the edges of the epitaxial silicon 42 and 38. Accordingly, the dimensions of the epitaxial silicon layer 42 and 38 should be large enough to insure the ability to accurately align the etch mask for the oxide layer 71 to meet the above criteria. In alternative embodiments, the implant shown in FIG. 10 (or the alternative emitter region formation step described below) may be done after the step of forming the PVX II layer 78 shown in FIG. 11 and after the contact windows are cut therein for the emitter and collector contacts. In this alternative embodiment, the emitter implant impurities must not go through the base contact window which will be exposed when the base contact and emitter contact windows are etched in the PVX II layer 78. Thus, some method of blocking the implant from passing through the base contact hole in which the contact 80 is formed must be used.

There are two ways at least of forming the emitter region 56 in the base epitaxial silicon column 42. The first way is by way of an implant of N type impurities. The dosage of this emitter implant is approximately $5 \times 10^{15}$ and the implant energy is approximately 60 to 80 KEV.

In alternative embodiments, the emitter 56 may be formed by depositing a layer of N doped polysilicon (not shown) over the column 42 of epitaxial silicon. The dopants are then driven into the epitaxial silicon by a heat step. The timing of the diffusion should be controlled to get the desired emitter depth from the top surface of the column 42 down along the y axis into the epitaxial silicon. For a deposited poly emitter formation method, the polysilicon should be doped N+ to about $1 \times 10^{16}$ atoms per square centimeter. The thermal drive in step is then performed at approximately 900 to 950 degrees centigrade for 10 to 30 minutes. Then the poly is etched off except for the location over the emitter region 56 and over the collector column 38 of epitaxial silicon thereby forming the emitter contact and the collector contact. If desired, the poly layer may also be left intact at the locations of any resistors or conductor lines which are desired at the level in the circuit above the planarized PVX II layer 78. This alternative embodiment has the added advantage that the emitter and collector contacts are formed without a separate step being needed to deposit some conductive material over the columns 42 and 38.

FIG. 11 shows the finished transistor structure after the metal contacts used in the preferred embodiment of the method have been formed. To form the metal contacts, a layer of aluminum or some other metal is deposited over the wafer. Then a layer of photoresist is deposited and developed to form an etch mask for the metal layer. Thereafter, the metal layer is etched to form the resistor contact 80, the base contact 82, the emitter contact 84 and the collector contact 86.

In alternative embodiments, the layer of metal deposited to make the contacts may be a refractory metal and a heat treatment may be conducted either before or after etching of the metal to convert any metal in contact with epitaxial silicon or poly to silicide at least partially. This has the added advantage of preventing any metal spiking which might cause the base-emitter junction to be shorted. FIG. 12 shows a refractory metal-silicide contact structure.

FIG. 13 shows another type of contact structure which may be employed in the transistor of the invention using polysilicon and silicide. This type of contact may be employed where the polysilicon and drive in method is used to form the emitter region 56. To form the contact structure of FIG. 13, the polysilicon contacts are first formed, and then a layer of refractory metal is deposited over the entire wafer. A heat treatment then is used to convert the refractory metal in contact with the polysilicon to silicide. Any refractory metal in contact with oxide or some other insulator will not be converted to silicide, and may be selectively etched away to leave the structure shown in FIG. 13.

Controlled Lateral Spread Embodiment

Another embodiment of the invention uses a controlled lateral spread of the selectively grown epitaxial layer over the top of an oxide layer as a sidewall base contact. The process to make this device starts out the same as the process to make the oxide etchback embodiment described above for the first few steps. That is, an N+ buried layer and channel stoppers are formed in the same manner as described with reference to FIG. 3. Next, a layer of oxide is grown over the surface of the wafer and two holes are etched in it over the buried layer as was done for the oxide etch back embodiment. Two epitaxially grown, monocrystalline silicon columns will be grown in these holes to serve as the emitter, base and collector regions of the transistor. The steps to form the oxide layer and the holes are the same as the steps used to form the oxide etched back transistor and the same considerations apply, e.g., the thickness of the oxide layer will be set in accordance with the desired base width. Generally, the thickness of the composite oxide layer is about 0.5 to 2 microns.

FIG. 14 shows the structure of the lateral growth embodiment in an early stage of the process of manufacture after the selectively grown epitaxial silicon is grown and allowed to laterally spread over the top of the oxide layer. To reach the stage shown in FIG. 14, epitaxial silicon columns 42 and 38 are grown in the holes 68 and 70, respectively, formed in the oxide layer 66 as described above. After the epitaxial silicon columns are grown, the structure is oxidized at 850 to 1000 degrees centigrade in dry oxygen for 30 minutes. This prevents leakage along the interface between the epitaxial silicon and the field oxide.

Throughout the discussion of this lateral spread embodiment, the same reference numerals will be used for structures which are the same or close to the same as the corresponding structures in the oxide etch back embodiment described above. Any differences in the structures or the methods of fabrication of same will be described here.

The difference over the oxide etch back embodiment described above is that the amount of hydrochloric acid (HCl) vapor present during the epitaxial growth is reduced in the lateral growth embodiment. This allows the selectively grown epitaxial silicon columns 42 and 38 to grow laterally out over the top of the oxide layer as shown at 100 and 102. Generally, the right level for HCl vapor depends upon the temperature and pressure at which the reaction is carried out. The reaction should be carried at a temperature somewhere between 800 and 1100 degrees Celsius and at a pressure between 25 and 80 torr. A temperature of 1000 degrees Celsius and a pressure of 45 torr are preferred. The relationship between the proper amount of HCl vapor and the temperature and pressure of the reaction is given in the paper by Borland and Drowley cited above which is incorporated by reference herein. Specifically, at page 146 of that article, graphs are given of the required HCl flow rate versus pressure and temperature at various flow rates of hydrogen gas.

FIG. 15A is the relationship of the HCl flow rate necessary to achieve selective epitaxial silicon growth at 25 torr and various temperatures.

FIG. 15B is the relationship of the HCl flow rate necessary to achieve selective epitaxial silicon growth at 80 torr and various temperatures. It can be seen from these figures that selective growth of epitaxial silicon occurs at lower HCl flow rates at lower temperatures. Lower temperatures of reaction are preferred to minimize donor concentrations in the epitaxial silicon grown using this method. The HCl rate should be selected for the reaction conditions chosen so that growth as opposed to etching occurs and so that the operating point, i.e., the point representing all the operating conditions is below line 104 in FIG. 15A or line 106 in FIG. 15B so that selective growth occurs during the phase when the holes 68 and 70 are being filled. After the holes are filled however, the HCl flow rate is changed, in the preferred embodiment, so that non selective growth occurs, i.e., the operating point is shifted to a point above line 104 in FIG. 15A or line 106 in FIG. 16B. This allows the epitaxial silicon to spread out over the oxide layer 66 as shown at 100 and 102. In alternative embodiments, the HCl rate does not have to be changed since the growth of epitaxial silicon over the oxide will occur anyway even if the HCl rate is not changed. The growth rate will be slower, but since not much overgrowth is necessary, the slow growth is acceptable.

Care should be taken to insure that the reaction temperature does not drop so low as to cause formation of polysilicon as opposed to epitaxial, single crystal silicon. Selective growth of epitaxial silicon can occur at temperatures as low as 800 degrees centigrade but the deposition rate at these temperatures is very low. The temperature should be kept below 1100 degrees centigrade however so as to minimize outdiffusion of dopants from the buried layer 34 into the epitaxial silicon in the holes 68 and 70 and into the substrate 30. For the oxide etchback embodiment described above, the HCl flow rate should be selected to cause selective growth only so as to prevent any lateral spreading.

The processes described herein can also be used to make CMOS or PMOS or NMOS transistors. The techniques described herein allow CMOS devices to be made without the use of P well isolation. This eliminates the parasitic devices which result from the presence of the p well thereby reducing latchup problems and increasing the device operating speed. Further, NMOS devices could be made on the laterally spread portions of the epitaxial silicon at 100 and 102 if the lateral spread can be made large enough to fit the devices on the laterally spread portions. In the bipolar devices taught herein, there is no need to grow the epitaxial silicon more than 2 microns laterally beyond the edges of the holes 68 and 70 assuming a 1 micron lithography design rule. The extent of the lateral growth, i.e., the dimension A in FIG. 14, need be no more than the minimum linewidth of the process being used plus adequate alignment tolerances. This is necessary to allow a contact window to be formed over the laterally spread portion of each base region epitaxial silicon column, i.e., the column 42.

FIG. 14 also shows a P type base implant to lightly dope the two columns 42 and 38 of epitaxial silicon P type. Typically, this implant will have a dosage of 5 to $20 \times 10^{12}$ atoms per square centimeter at an energy of 15-40 KEV.

FIG. 16 shows the structure of during the N type implant used to dope the collector column of silicon N type. During this implant the column of epitaxial silicon 42 is protected from the ions by a layer of photoresist 108, but the ions are free to enter the epitaxial silicon column 38 which will form the collector contact. This implant is normally done at 80-150 KEV and a dosage of $5 \times 10^{15}$ atoms per square centimeter for a column height, i.e., the dimension B in FIG. 15 of 4000 to 8000 angstroms. After this implant, the photoresist is removed.

FIG. 17 shows the structure after the polysilicon layer which will form the emitter and collector contact structures has been deposited, doped N+ and etched and during a boron implant to decrease the resistance of the laterally spread portions of the epitaxial silicon. The first step is to deposit a layer of polysilicon over the laterally spread epitaxial silicon to a thickness of 1000-3000 angstroms. Then this polysilicon is doped N+ with an arsenic implant or other N type dopant. The polysilicon layer is then masked with a layer of photoresist which is exposed and developed to leave two portions 110 and 112 of photoresist over the columns as etch masks. The polysilicon is then etched with a plasma or other etch to leave the emitter contact portion 114 and the collector contact portion 116. Finally, the structure as thus configured is subjected to a boron implant at 15 to 40 KEV with a dosage of from $1 \times 10^{13}$ to $1 \times 10^{15}$ to reduce the resistivity of the laterally spread portion of the epitaxial silicon.

FIG. 18 shows the process step of forming oxide sidewall spacers on the polysilicon electrodes using a plasma etch.

The purpose of this step is to create a layer of electrically insulating material on the sidewalls of the polysilicon electrodes 114 and 116 which are perpendicular to the surface of the substrate, i.e., in the y-z plane. To do this using an anisotropic etch, the first step is to deposit a layer of oxide 118. In alternative embodiments, a layer of silicon nitride may be used. The layer of insulating material 118 may be deposited in any known manner and the manner of deposit is not critical to the invention. The thickness of this layer 118 of insulating material is 1500 to 4000 angstroms in the preferred embodiment. This thickness is selected to provide sufficient electrical integrity between the base contact and the emitter contact. However, it should not be so thick as to prevent sufficient alignment tolerance for formation of the base contact windows over the laterally grown epitaxial silicon. The alignment tolerance mentioned here is distance from the lateral extent on the x axis of the spacer shoulder formed in the step shown in FIG. 18 and the most lateral extent along the x axis of the laterally grown epitaxial silicon.

After depositing the layer 118, an anisotropic plasma etch (or reactive ion etch) is performed of sufficient duration to remove all portions of the insulating layer 118 lying in the x-y plane. i.e., parallel to the surface of the substrate.

Either before after or during formation of the oxide layer 118, a drive in step is performed to form the emitter region 119 in the base epitaxial silicon 42. This drive in step is a heat treatment in a diffusion furnace which causes the N+ impurities from the emitter poly 114 to diffuse into the base epitaxial silicon and convert the region 119 from P− doping to N+ doping. The time and temperature of this drive in step depends upon the desired base width from the emitter-base junction to the base collector junction, upon the height (dimension A in FIG. 18) and upon the doping level of the base epitaxial silicon 42. In the preferred embodiment with the dimension A of 4000 to 8000 angstroms and a base width of 1000 to 2000 angstroms and a base doping of 2 to $20 \times 10^{12}$ atoms per square centimeter, the drive in step should be performed at between 800 amd 1000 degrees centigrade for between 15 and 45 minutes. The preferred embodiment uses temperatures between 850 and 950 degrees centigrade. The correct time and temperature for the emitter drive in must be experimentally determined given the parameters for desired base width, base doping and epitaxial silicon height the user is using.

Any oxide that is inadvertently formed during this step should be removed before the next step. Preferably, the emitter drive in step is performed in a nitrogen ambient to prevent any oxide from forming.

FIG. 19 shows the structure after the insulating spacers have been formed on the sides and layers of silicide have been formed on the tops of the polysilicon contacts. The insulating spacers formed in the step shown in FIG. 18 are shown at 120 and 122 for the emitter contact 114 and at 124 and 126 for the collector contact. Actually, the spacers are continuous around the edges of the polysilicon contacts 114 and 116. The silicide layers on top of the polysilicon contacts are shown at 128 and 130. Silicide is also formed on top of the laterally grown portions of the epitaxial silicon as shown at 132, 134, 136 and 138. These layers are formed by depositing a layer of refractory metal over the structure and heat treating it in known fashion to form silicide everywhere the refractory metal is in contact with silicon. The silicide formation reaction is done at approximately 700 degrees centigrade for approximately 30 seconds in a rapid thermal anneal process at atmospheric pressure in nitrogen ambient. After the silicide if formed, the unreacted refractory metal is removed to leave the structure as shown in FIG. 19. The presence of the silicide reduces the sheet resistance of the contact structures from about 200 ohms per square for doped polysilicon to 2 ohms per square for silicide coated polysilicon and silicide coated doped epitaxial silicon. The silicide layer does not have to be formed, but if it is not formed, a higher base resistance and series resistance with the emitter and collector contacts will result. By virtue of the contact to the base from the sidewall instead of having to have an extended path through the epi to the surface from the emitter-base junction in the epitaxial silicon, the extrinsic base resistance, i.e., the resistance of the path from the base emitter junction to the surface contact, is reduced substantially.

FIG. 20 shows a cross sectional view of the finished structure after metal contacts have be formed in contact windows in an overlying insulating layer. To reach the stage shown in FIG. 20, a layer 140 of insulating material capable of being reflowed is deposited over the structure. Such materials are well known in the art and include PVX II. Further, the layer 140 might actually be comprised of two or more layers of material. The layer 140 could be deposited by chemical vapor deposition or could be spun on depending upon the choice of materials. Any known method of forming a planarized layer of insulating material which is compatible with the underlying structures thermally and electrically will suffice. It is generally good practice to choose a material which will not crack as temperatures change due to differences in coefficients of thermal expansion. Further, it is good practice to choose a material which can be planarized at temperatures which will not cause outdiffusion of the impurities in the poly into the silicide or excessive diffusion of doped areas in the epitaxial silicon. Also, it is good practice to choose materials which do not have excessive impurities which will diffuse into the underlying structure and change its electrical characteristics. PVX II or known types of spun on gels which can be heat treated to turn them into binary glasses such as are known in the art will suffice for purposes of practicing the invention.

After the layer 140 is formed, contact holes are cut over the locations of the emitter contact, the base contacts and the collector contact. The sizes of the emitter contact and collector contact should be such that a contact hole of at least the minimum linewidth on a side may be formed over the contacts with adequate alignment tolerances on each side of the contact hole. In some embodiments, the cross sectional area of the epitaxial silicon columns is the minimum obtainable area, i.e., the minimum linewidth on a side. The emitter contact may then be formed slightly larger than this minimum area such that a contact hole having the minimum obtainable cross sectional area may fit within the perimeter of the polysilicon contact. In other embodiments, the polysilicon of the emitter and base contacts may be extended out over the oxide field and expanded into a contact pad of sufficient dimension to fit a contact hole.

The lateral extents of the epitaxial silicon should be sufficient to allow a contact hole to be at least partially formed over the portion of the epitaxial silicon that extends past the insulating shoulder.

After all the contact holes are formed, a layer (not shown) of metal such as aluminum, a refractory metal such as titanium or tungsten or any other suitable metal or combination of metals or other conductive materials is deposited over the surface of the layer 140. This metal or other conductive material enters the contact holes and makes contact with the underlying emitter, collector and base contacts. The metal layer may then be patterned using photolithography and etching techniques to form a first layer metal interconnection pattern connecting the nodes of the transistor to other nodes in the circuit. As shown in FIG. 20, the emitter contact 142, the base contact 144 and the base contacts 146 are shown as metal. These contacts may also be made in the manner described with reference to FIG. 13.

FIG. 21 shows a top view of the finished device.

The advantages of the transistor structures taught herein include vastly improved speed bipolar transistors coupled with high density comparable with CMOS and NMOS. The size of the active region is the same as the size of the isolation island. Since the area of the base-emitter and collector-base junctions can be equal to the minimum linewidth, the parasitic junction capacitances associated with these junctions is much less. Further, since the base current path from the base contact to the base-emitter junction is shorter, the extrinsic base resistance is less. This also improves the transistor speed.

Although the invention has been described in terms of the preferred and alternative embodiments given herein, those skilled in the art will appreciate other alternative embodiments which may exist and which do not depart from the spirit of the invention. All such embodiments are intended to be included within the scope of the claims appended hereto.

What is claimed is:

1. An integrated circuit bipolar transistor comprising:
   a buried layer of a first conductivity type in a substrate;
   first and second columns of epitaxial material on said buried layer;
   first insulating layer of silicon dioxide on said buried layer and surrounding said epitaxial columns;
   a monocrystalline conducting layer on said first insulating layer and laterally contacting an upper portion of said first epitaxial column, said upper portion being a second conductivity type;
   a region of said first conductivity type formed at the top of said first epitaxial column; and
   a second insulating layer over said conducting layer, said second insulating layer having varying thicknesses to substantially form a planar surface;
   whereby said buried layer, said upper portion and said region respectively form portions of a collector, a base and emitter of said bipolar transistor.

2. An integrated circuit bipolar transistor as in claim 1 further comprising a third insulating layer between said conducting layer and said second insulating layer, said third insulating layer oxidized from said conducting layer.

3. An integrated circuit bipolar transistor as in claim 2 wherein said third insulating layer extends over the top of said first epitaxial column with an aperture over said emitter region whereby access is provided thereto.

4. An integrated circuit bipolar transistor comprising:
   a buried layer of a first conductivity type in a substrate;
   first and second columns of epitaxial material on said buried layer;
   a first insulating layer of silicon dioxide on said buried layer and surrounding said epitaxial columns;
   a monocrystalline conducting layer comprising epitaxial material extending laterally from an upper portion of said first epitaxial column onto said first insulating layer, said upper portion being a second conductivity type;
   a region of said first conductivity type formed at the top of said first epitaxial column; and
   whereby said buried layer, said upper portion and said region respectively form portions of a collector, a base and emitter of said bipolar transistor.

5. An integrated circuit bipolar transistor as in claim 4 further comprising a polysilicon layer of said first conductivity type in contact with said emitter region, said polysilicon layer defined to expose said epitaxial material extending laterally form said first epitaxial column.

6. An integrated circuit bipolar transistor as in claim 5 further comprising a metal silicide layer defined coextensively with said polysilicon layer to provide an emitter contact and with said epitaxial material laterally extending from said first epitaxial column to provide a base contact.

7. An integrated circuit bipolar transistor as in claim 6 wherein said insulating material at the sides of said defined polysilicon layer separates said metal silicide emitter contact layer and said metal silicide base contact.

8. An integrated circuit bipolar transistor as in claim 4 wherein said second epitaxial column is of said first conductivity type to form a contact to said buried layer.

9. An integrated circuit bipolar transistor comprising:
   a buried layer of a first conductivity type in a substrate of a second conductivity type;
   first and second columns of epitaxial material on said buried layer, each column having top surfaces, said top surfaces having a predetermined height above said buried layer, a top portion of said first column being of said second conductivity type;
   a region of said first conductivity type formed at the top surface and within said top portion of said first column;
   a first insulating layer of silicon dioxide on said buried layer and surrounding said first and second columns to a distance below said predetermined height; and a monocrystalline silicon conducting layer on said first insulating layer and laterally contacting said first column up to said predetermined height;

whereby said buried layer, said top portion and said region form collector, base and emitter regions of said bipolar transistor.

10. An integrated circuit bipolar transistor as in claim 9 wherein said second column is of said first conductivity type to form a contact to said buried layer.

11. An integrated circuit bipolar transistor as in claim 9 wherein said first and second columns are of constant cross-section 12. An integrated circuit bipolar transistor as in claim 11 further comprising:

a second insulating layer on said conducting layer and having varying thicknesses so that the upper surface of said second insulating layer is substantially planar.

13. An integrated circuit bipolar transistor as in claim 12 further comprising:

a third insulating layer between said conducting layer and said second insulating layer, said third insulating layer extending over said top of said first epitaxial column and having an aperture over said emitter region to provide access thereto.

14. An integrated circuit bipolar transistor as in claim 13 wherein said emitter region is located within said first column cross-section.

15. An integrated circuit bipolar transistor as in claim 13 wherein said second nd third insulating layers comprise silicon dioxide, and said conducting layer comprises polysilicon.

16. An integrated circuit bipolar transistor as in claim 9 wherein said conducting layer comprises epitaxial material extending laterally from said first epitaxial column onto said first insulating layer.

17. An integrated circuit bipolar transistor as in claim 16 further comprising a polysilicon layer of said first conductivity type in contact with said emitter region, said polysilicon layer defined to expose said epitaxial material extending laterally from said first epitaxial column.

18. An integrated circuit bipolar transistor as in claim 17 further comprising a metal silicide layer defined coextensively with said polysilicon layer to provide an emitter contact and with said epitaxial material laterally extending from said first epitaxial column to provide a base contact.

19. An integrated circuit bipolar transistor as in claim 18 wherein said insulating material at the sides of said defined polysilicon layer separates said metal silicide emitter contact layer and said metal silicide base contact.

* * * * *